United States Patent
Rahhal-Orabi (10) Patent No.: US 7,655,986 B2
(45) Date of Patent: Feb. 2, 2010

(54) SYSTEMS AND METHODS FOR REDUCING CONTACT TO GATE SHORTS

(75) Inventor: Nadia Rahhal-Orabi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 11/644,639

(22) Filed: Dec. 21, 2006

(65) Prior Publication Data

US 2008/0150049 A1    Jun. 26, 2008

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/382; 257/383; 257/384; 257/E29.127

(58) Field of Classification Search ............. 257/382, 257/383, 384, E29.127
See application file for complete search history.

(56) References Cited

U.S. PATENT DOCUMENTS

| | | | | |
|---|---|---|---|---|
| 5,792,703 A | * | 8/1998 | Bronner et al. | 438/620 |
| 6,274,468 B1 | * | 8/2001 | Hsu | 438/586 |
| 6,294,449 B1 | * | 9/2001 | Wu et al. | 438/597 |
| 7,294,890 B2 | * | 11/2007 | Lo et al. | 257/384 |
| 2003/0116808 A1 | * | 6/2003 | Oguchi | 257/382 |
| 2003/0141554 A1 | * | 7/2003 | Uehara et al. | 257/382 |

* cited by examiner

*Primary Examiner*—Phat X Cao
(74) *Attorney, Agent, or Firm*—Blakely, Sokoloff, Taylor & Zafman LLP (57) ABSTRACT

A method for reducing contact to gate shorts in a semiconductor device and the resulting semiconductor device are described. In one embodiment, a gate is formed on a substrate, a contact is formed on the gate and the substrate, and an insulator is formed between the gate and the contact. The insulator may be formed by oxidizing the gate to form a dielectric between the contact and the gate after the contact is formed on the gate.

8 Claims, 8 Drawing Sheets

SYSTEMS AND METHODS FOR REDUCING CONTACT TO GATE SHORTS

FIELD

The present invention relates generally to semiconductor structures and manufacturing. In particular, the present invention relates to a process for reducing contact to gate shorts in a semiconductor device, and the resulting semiconductor device.

BACKGROUND

Advances in semiconductor manufacturing technology have led to the integration of billions of circuit elements, such as transistors, on a single integrated circuit (IC). In order to integrate increasing numbers of circuit elements onto an integrated circuit it has been necessary to reduce the dimensions of the electronic devices (e.g., a metal-oxide-semiconductor (MOS) transistor).

Figure 1:
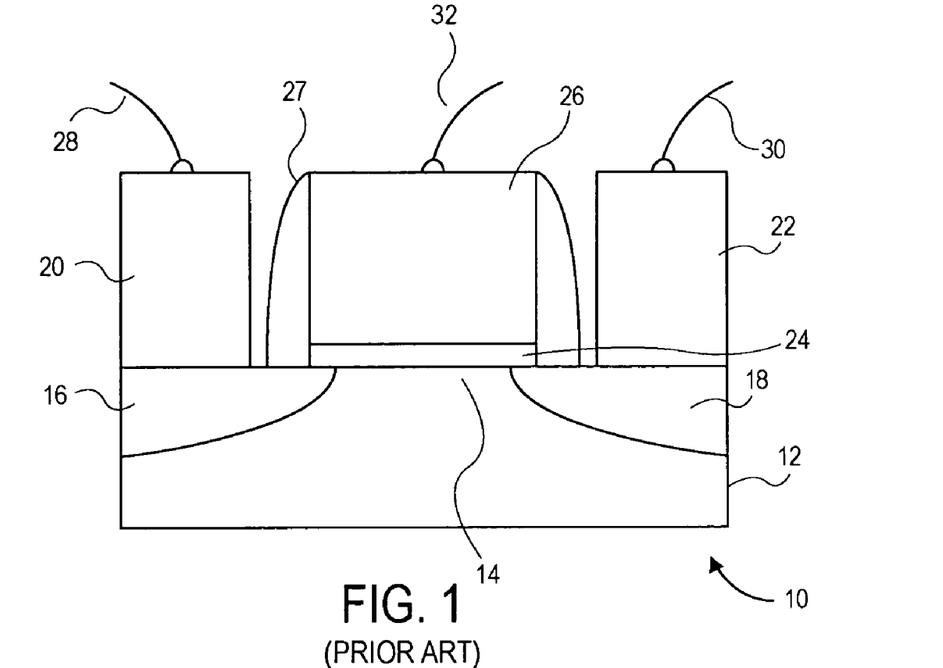
FIG. 1 is a side sectional view of a transistor.

A transistor 10, made using conventional techniques, is shown in FIG. 1 of the accompanying drawings. The transistor 10 includes a substrate 12, a channel region 14, source region 16, drain region 18, source contact 20, drain contact 22, gate dielectric layer 24, gate electrode 26 and spacers 27. The transistor may also include contact terminals 28 and 30 and gate terminal 32.

Figure 2:
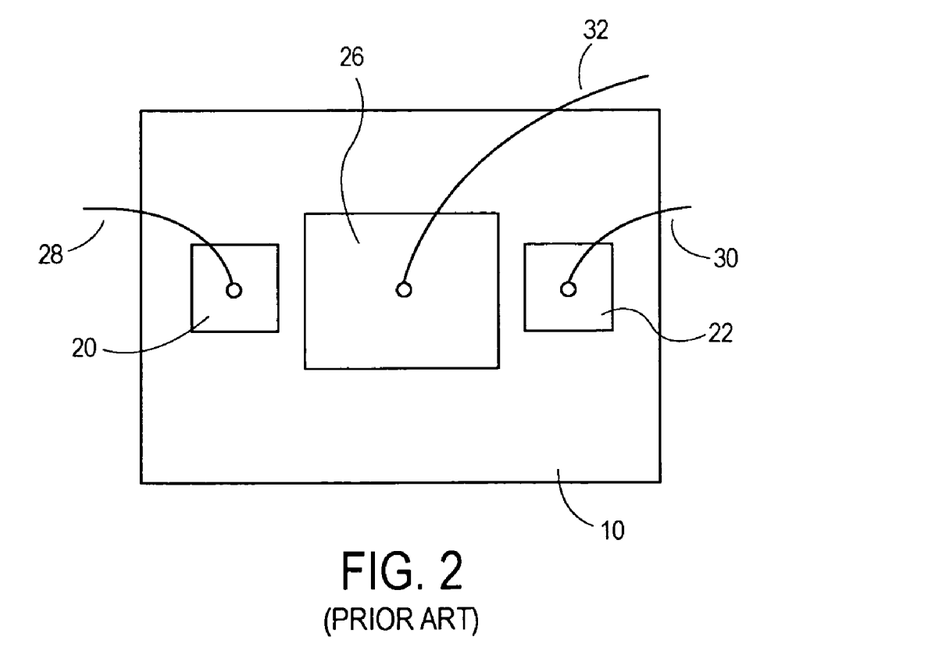
FIG. 2 is a top view of the transistor of FIG. 1.

The gate dielectric layer 24 is formed on the substrate 10, over the channel region 14. The gate electrode 26 is formed on the gate dielectric layer 24. The source and drain regions 16, 18 are formed on opposing sides of the channel region 14 in the substrate. The source and drain contacts 20, 22 are formed over the source and drain regions 16, 18, respectively. The spacers are provided on opposite sides of the gate dielectric layer 24 and gate electrode 26, and over the source and drain regions 16, 18. The gate electrode 26 may be a p-type, n-type or mid-gap metal. The contact terminals 28 and 30 are connected to the source and drain contacts 20 and 22, respectively, and gate terminal 32 is connected to gate electrode 26. As shown in FIGS. 1 and 2, the contacts 20, 22 are separated by a distance from the gate electrode 26. This distance is typically referred to as a registration window.

Figure 3:
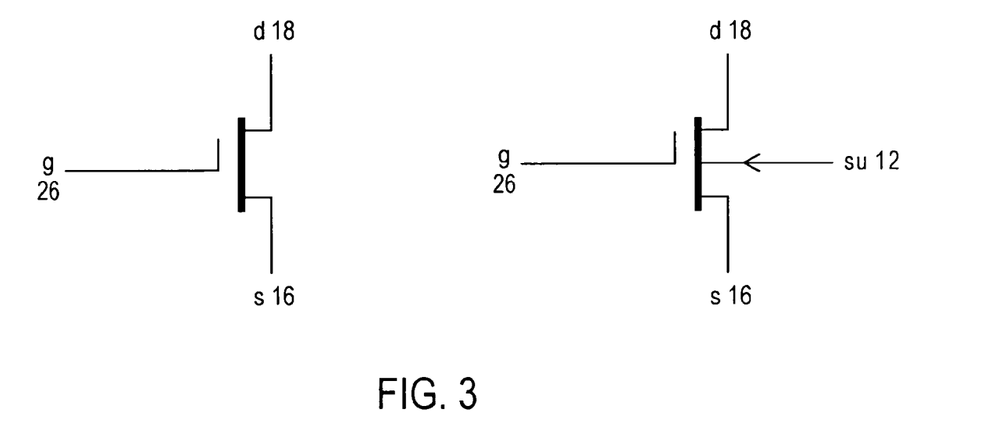
FIG. 3 is a circuit diagram of a n-channel MOSFET.
Figure 4:
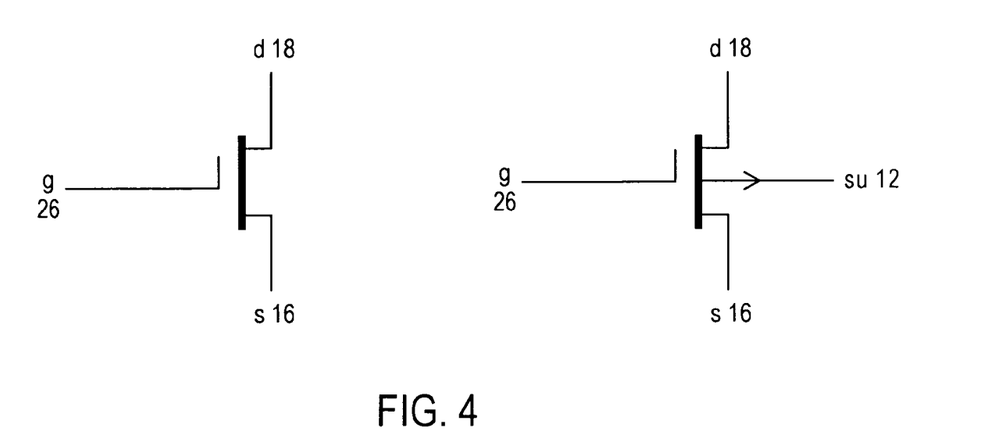
FIG. 4 is a circuit diagram of a p-channel MOSFET.

In use, a voltage is applied to the source region 16 of the transistor 10, causing current to flow through the channel region 14 to the drain 18. A voltage is also applied to the gate electrode 26 of the transistor, which interferes with the current flowing in the channel region 14 of the transistor. The voltage connected to the gate electrode 26 switches the current on and off in the channel region 14 of the transistor at any given time. A circuit diagram of an n-channel transistor is shown in FIG. 3. A circuit diagram of a p-channel transistor is shown in FIG. 4.

If the metallic gate electrode 26 and metallic contacts 20, 22 come into contact, a short circuit occurs. In conventional processes, the registration window and critical dimensions are controlled to ensure that the contacts 20, 22 avoid the gate electrode 26. However, protecting the gate from the contact is becoming more challenging as the gate pitch is getting smaller and registration requirements are becoming more difficult to meet with existing processes. For example, a sub-ten nm contact CD (critical dimension) is required to deliver a manfucaturable registration window for these scaled transistors; however, current processes only allow a registration window of about 15 nm. These contact to gate shorts are substantial yield limiters.

BRIEF DESCRIPTION OF THE DRAWINGS

The invention is described by way of example with reference to the accompanying drawings, wherein.

DETAILED DESCRIPTION

In one embodiment, contact to gate shorts are reduced by separating the gate and contact after the contact touches the gate. That is, the gate and contact are isolated from one another where a short circuit occurs. In particular, in one embodiment, a short circuit caused by the contact touching the gate is reversed by growing an oxidation layer on the shorted part of the gate. The oxidation layer forms a dielectric that insulates the gate from the contacts, thereby reversing the short circuit.

FIGS. 5-11 show a process for forming a semiconductor device 100 (FIG. 11) according to one embodiment of the invention.

Figure 5:
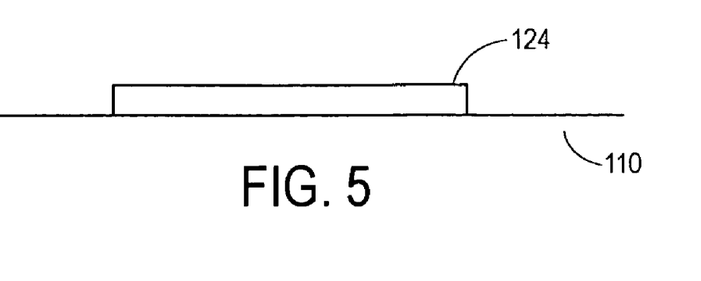
FIG. 5 is a side sectional view showing formation of a gate dielectric on a substrate according to an embodiment of the invention.

As shown in FIG. 5, the process begins by providing a substrate 110.

Any well-known substrate, such as, but not limited to, a monocrystalline silicon may be used. In one embodiment, the substrate 110 is a silicon wafer. The substrate 110 may be formed from other materials, such as, but not limited to, germanium, indium antimonide, lead telluride, indium arsenide, indium phosphide, gallium arsenide, gallium antimonide and the like. The substrate 110 may be a silicon-on-insulator structure.

With reference back to FIG. 5, the process continues by depositing a dielectric layer 124 on the substrate 110. In one embodiment, the dielectric layer 124 is a gate dielectric layer.

In one embodiment, the dielectric layer 124 is made of a high-k material; that is, the high-k dielectric layer 124 is made of a material having a dielectric constant (k) greater than that of silicon dioxide (e.g., ~4). Some of the materials that may be used to make the high-k gate dielectric layer 12 include, but are not limited to: hafnium oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, lead zinc niobate, and the like. In one embodiment, the dielectric is made from non-high-k materials, such as for example, silicon dioxide or other non-high k materials.

In one embodiment, the dielectric layer 124 is sufficiently thick to electrically isolate the substrate from a subsequently formed gate electrode. In one embodiment, the thickness of the dielectric layer 124 is about 5-25 angstroms.

The dielectric layer 124 may be formed on substrate 112 using any suitable technique including, but not limited to, atomic layer deposition (ALD), thermal oxidation, chemical vapor deposition (CVD) and physical vapor deposition (PVD) processes. In one embodiment, the dielectric layer is formed by an ALD process. In the ALD process, the dielectric layer 12 is formed by exposing the substrate to alternating metal-containing precursors and oxygen-containing precursors until a layer having the desired thickness has been formed. Exemplary metal precursors include hafnium tetrachloride and lanthanum trichloride. An exemplary oxygen-containing precursor is water. In another embodiment, the dielectric layer 124 is formed by depositing a metal layer on the substrate and then thermally oxidizing the metal layer.

Figure 6:
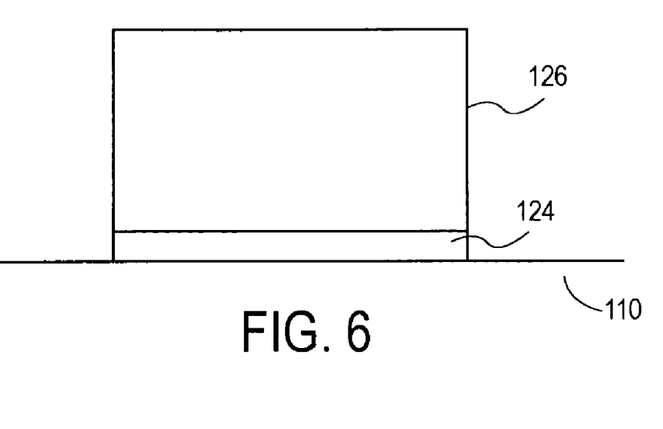
FIG. 6 is a schematic side view showing formation of a gate electrode on the substrate according to an embodiment of the invention.

The process continues by depositing a gate electrode 126 on the dielectric layer 124, as shown in FIG. 6.

In one embodiment, the gate electrode 126 is metallic. A single metal or multiple metals may be used. Exemplary metals include, but are not limited to, aluminum (Al); titanium (Ti); molybdenum (Mo); tungsten (W); metal nitrides and carbides, such as, $Ti_xN_y$, $Ti_xC_y$, $Ta_xN_y$, $Ta_xC_y$; and, the like. In an embodiment for a PMOS transistor, a p-type metal having a p-type work function (WF=4.9-5.3eV) is used. In an embodiment for a NMOS transistor, a n-type metal having a n-type work function (WF=3.9-4.3eV) is used. In another embodiment, a mid-gap metal (WF=4.3-4.9eV) may be used.

In one embodiment, the gate electrode 126 is a metallic silicide. It will be appreciated that the gate electrode may be formed entirely of metallic silicide, substantially entirely of metallic silicide or partially of metallic silicide. In an embodiment wherein the gate electrode 126 is a metallic silicide, the gate electrode 126 is typically formed of polysilicon when it is deposited, and is subsequently converted partially, substantially entirely, or entirely into metallic silicide, as known to those of skill in the art. In one embodiment, the metallic silicide is, for example, nickel silicide.

The gate electrode 126 is deposited using any well known process.

A polishing process, such as chemical mechanical polishing (CMP), may be performed to planarize the surface and expose the gate electrode 126.

The gate electrode 126 may be subsequently patterned with, for example, well-known photolithography and etching techniques.

Figure 7:
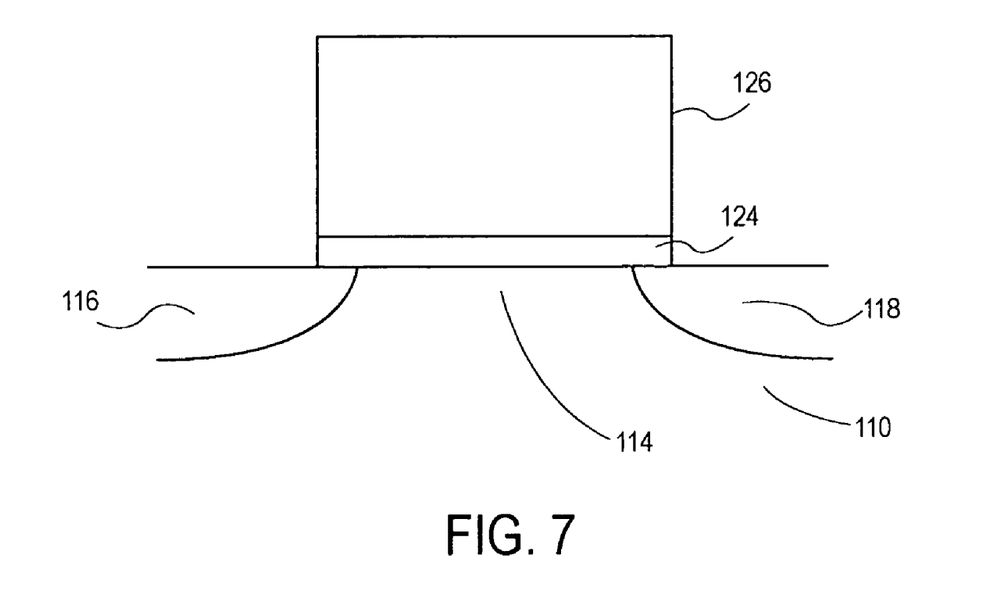
FIG. 7 is a side sectional view showing formation of source and drain regions in a substrate according to an embodiment of the invention.

The process continues, as shown in FIG. 7, by implanting the substrate 110 with ions to form source 116 and drain 118. A channel region 114 is thereby formed between the source and drain 116, 118. The ions may be implanted using well-known ion implantation techniques.

Figure 8:
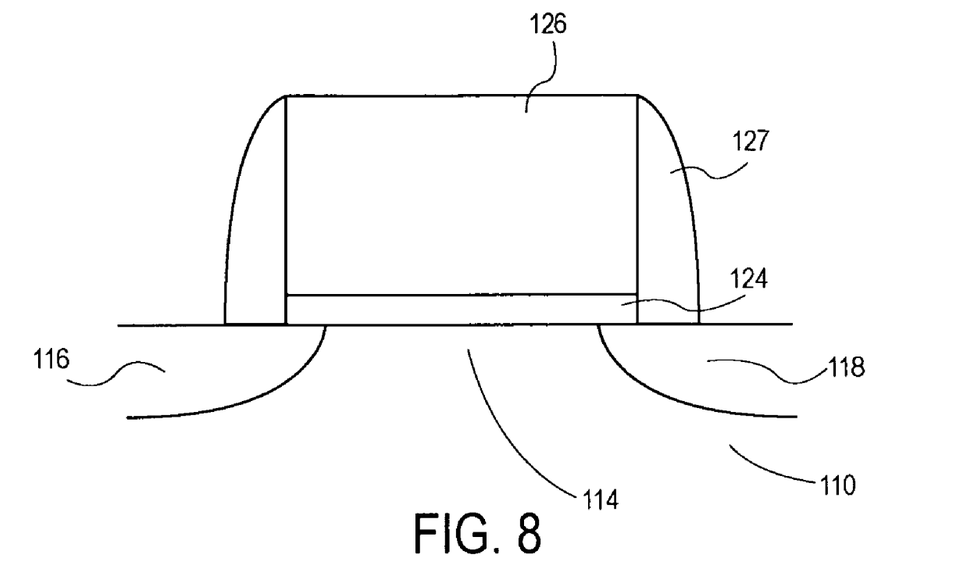
FIG. 8 is a side sectional view showing formation of spacers according to an embodiment of the invention.

As shown in FIG. 8, the process may continue by depositing spacers 127. Spacers 127 seal the sides of the gate electrode 126 and encapsulate the gate dielectric layer 124.

The spacers 127 are typically made of nitride or oxide. Exemplary spacers materials include, not are not limited to, silicon nitride, carbon doped nitride, and carbon doped nitride without oxide components.

In one embodiment, the spacers 127 are formed by a CVD process. Other well-known processes may be used to form the spacers 127.

In one embodiment, a high temperature step may follow spacer deposition, which anneals the dielectric layer 124 and activates the implanted dopants. In one embodiment, the high temperature step is a source drain anneal (SDAL). In one embodiment, the high temperature step is a rapid thermal anneal (RTA).

In one embodiment, silicide is formed during the high temperature step. In particular, in one embodiment, self-aligned silicide (SALICIDE) may be formed during the high temperature step. The silicide may be used to form low-resistance contacts and/or a gate electrode comprising silicide. In one embodiment, the gate electrode may be formed partially of polysilicon and partially of the metallic silicide, entirely of the metallic silicide or substantially entirely of the metallic silicide.

Figure 9:
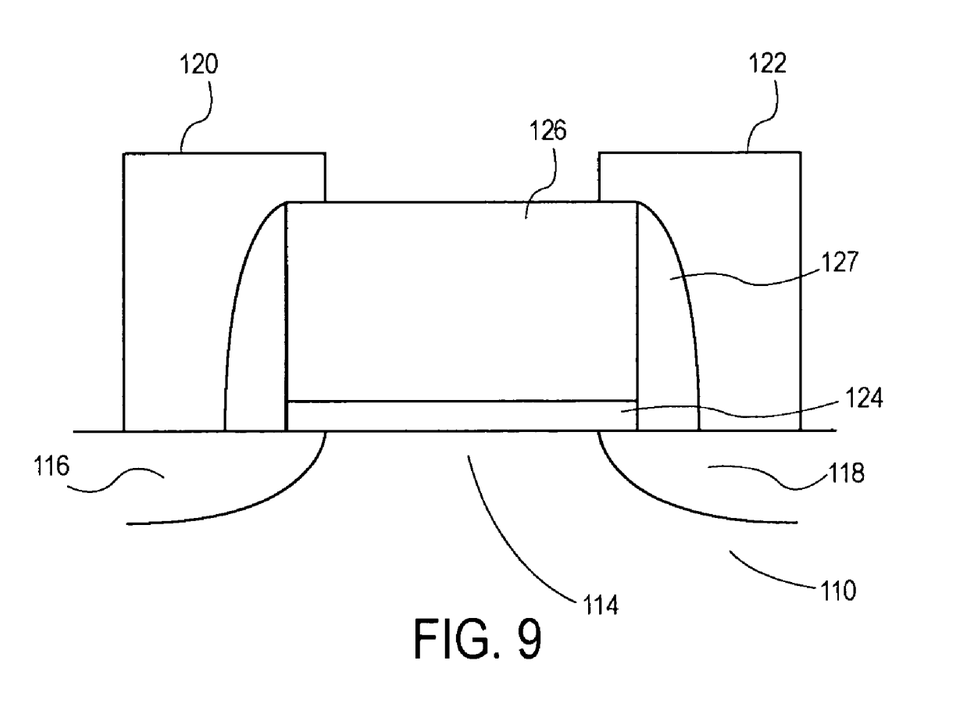
FIG. 9 is a side sectional view showing formation of a source and drain contacts according to an embodiment of the invention.

As shown in FIG. 9, the source contact 120 is formed over the source region 116, the drain contact 122 is formed over the drain region 118, and a portion of the contacts 120, 122 may be formed at least in part on the gate electrode 126. As explained hereinabove, the formation of the metallic contacts 120, 122 on the metallic gate electrode 126 results in a short circuit of the semiconductor device. It will be appreciated that during the process, the contacts may not be formed on the gate electrode at all, either the source contact or the drain contact may be formed on the gate electrode, or both the source contact and the drain contact may be formed on the gate electrode. It will also be appreciated that the amount of the contact that contacts the gate electrode may vary.

Figure 10:
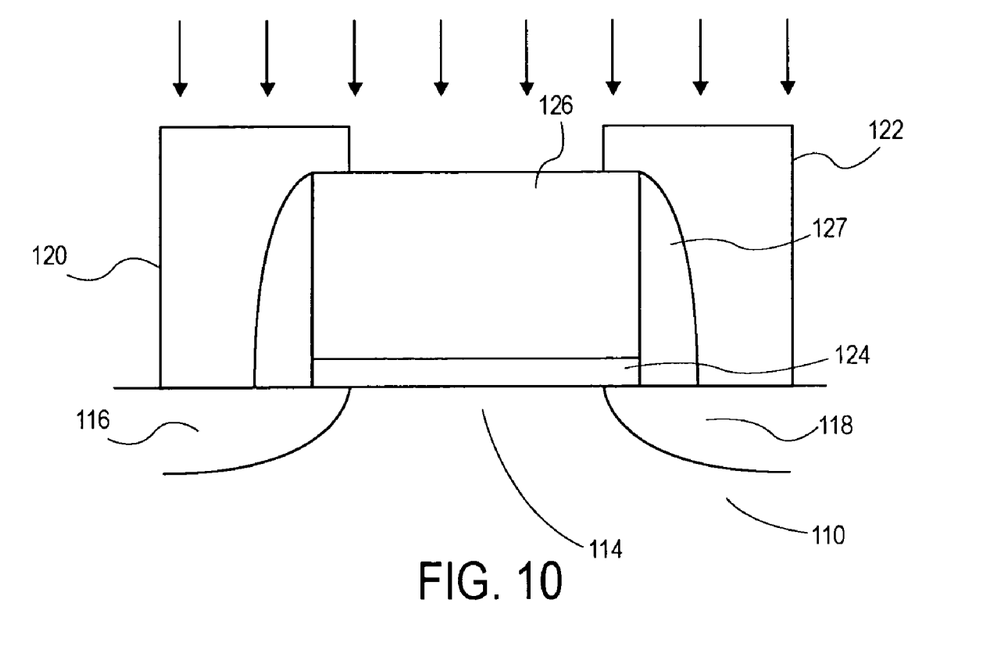
FIG. 10 is a side sectional view showing oxidation of the semiconductor device according to an embodiment of the invention.

With reference to FIG. 10, the short circuit may be reversed by oxidizing the gate electrode 126. That is, after the short circuit is created by the one or more metallic contacts touching the gate electrode, an oxidation process may be used to form a dielectric between the contact(s) and the gate electrode. The dielectric reverses the short circuit by acting as an insulator, preventing electron flow between the contacts and the gate electrode.

In one embodiment, the oxidization process includes etching with an oxygen rich plasma and a thermal cycle on an asher. For example, a high oxygen plasma etch on an etcher for about five minutes may be followed by about a ten second high temperature (273) ash may be used. Other oxidation processes may be used to reverse the short circuit.

Figure 11:
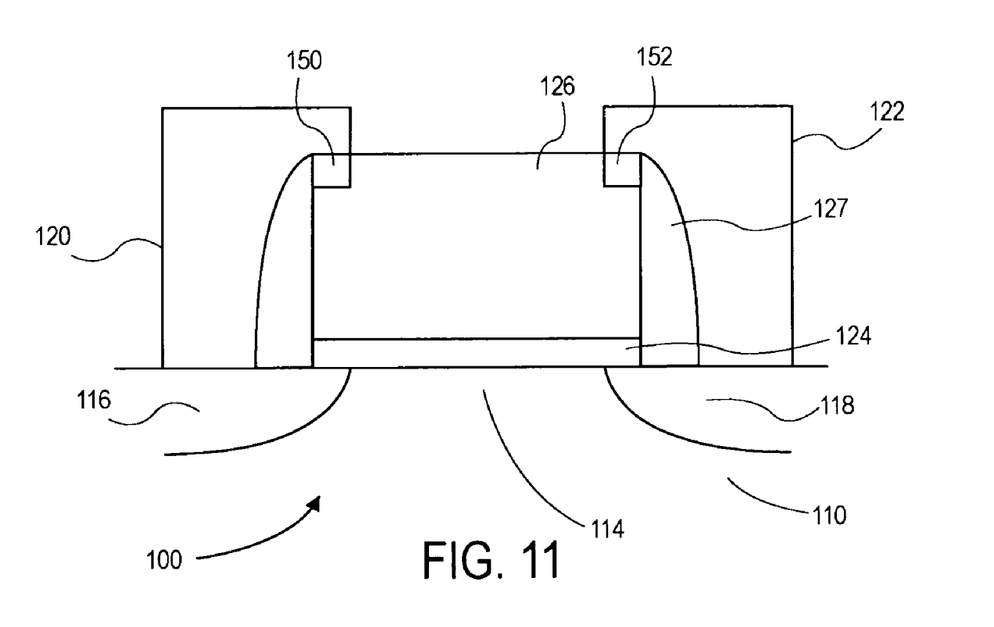
FIG. 11 is a side sectional view showing formation of an insulation layer between the gate electrode and a portion of the contacts according to an embodiment of the invention.

As shown in FIG. 11, the oxidation process forms an insulator 150, 152 at the portions where the contacts 120, 122 contact the gate electrode 126. The oxidation layer is formed on any exposed metal. It will be appreciated that because the gate electrode 126 and contacts 120, 122 are typically protected by a thin layer of nitride, the only exposed metal that will oxidize should be where the contacts 120, 122 touch the gate electrode 126.

The insulators 150, 152 may be a dielectric material. In one embodiment, the dielectric material is nickel oxide. It will be appreciated that other dielectric materials may be formed depending on the gate material. The insulators 150, 152 are formed from a material and has a thickness sufficient to prevent electron flow between the contacts 120, 122 and the gate electrode 156.

The semiconductor device 100 formed using the above process, shown in FIG. 11, includes a substrate 110, a channel region 114, source region 116, drain region 118, source contact 120, drain contact 122, gate dielectric layer 124, gate electrode 126 and spacers 127. In addition, the semiconductor device 100 may include a source insulator 150 and/or a drain insulator 152. As explained above, the insulators 150, 152 are formed between the gate electrode 126 and source contact 120 and drain contact 122, respectively, where the gate electrode 126 and contacts 120, 122 touch one another.

Figure 12:
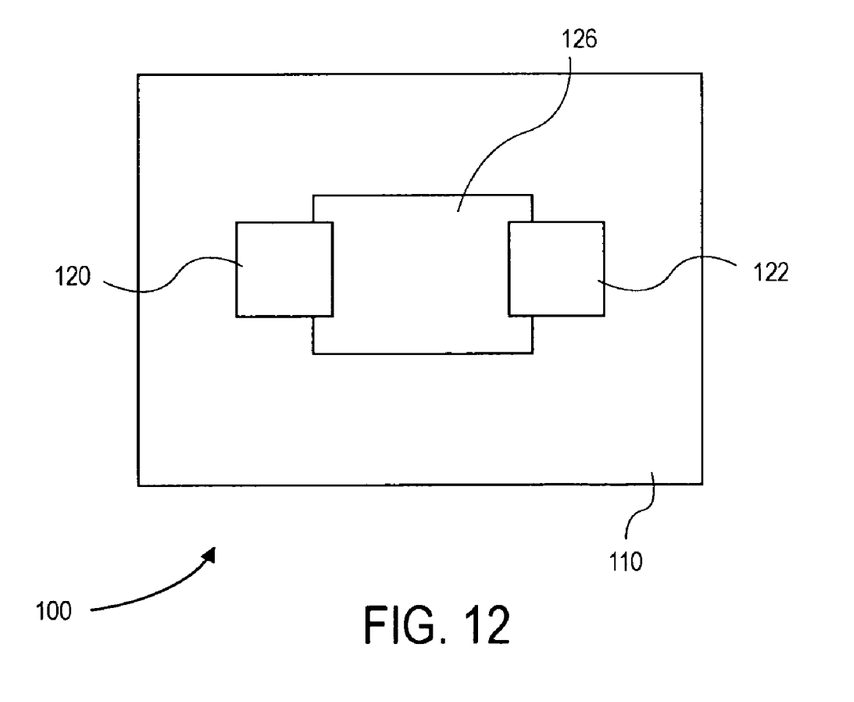
FIG. 12 is a top view of the semiconductor device of FIG. 11.

FIG. 12 is a top view showing a semiconductor device 100 formed using the above process. As shown in FIG. 12, a portion of the contacts 120, 122 may overlap a portion of the gate electrode 126. The resulting semiconductor device 100 does not short circuit because the insulators 150, 152 are present between the contacts 120, 122 and the gate electrode 126.

Figure 13:
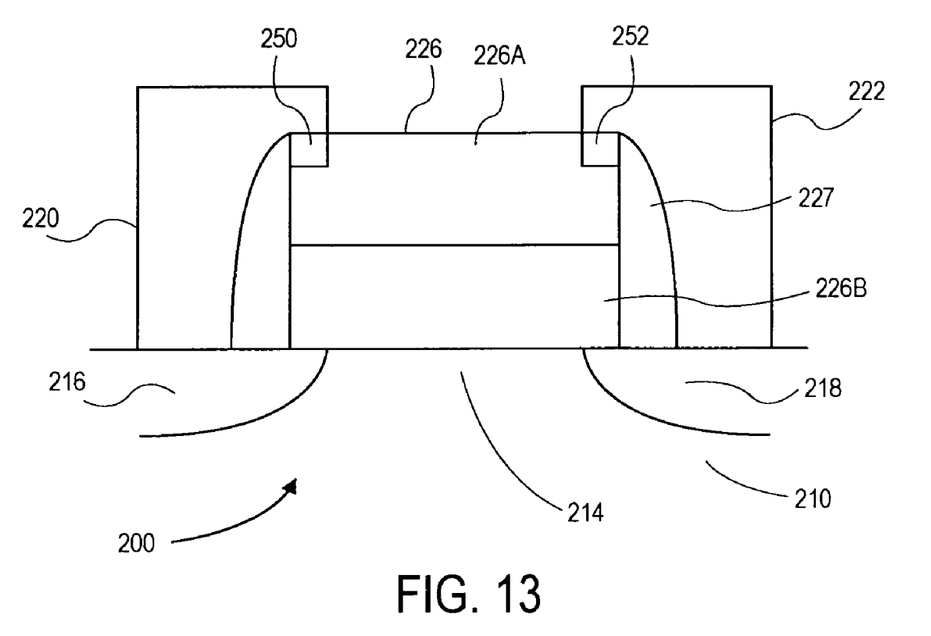
FIG. 13 is a side sectional view showing a semiconductor device having an insulation layer and a gate electrode having a polysilicon and metal silicide layer according to an embodiment of the invention.

FIG. 13 is a side sectional view of a semiconductor device 200 formed using a process similar to that described above with reference to FIGS. 5-11. The semiconductor device 200 includes a substrate 210, a channel region 214, source region 216, drain region 218, source contact 220, drain contact 222, gate dielectric layer 224, gate electrode 226 and spacers 227.

The gate electrode 226 includes a metallic silicide portion 226a and a polysilicon portion 226b. As with semiconductor device 100, the semiconductor device 200 short circuits if the metallic contacts touch the metallic silicide portion 226a of the gate electrode 226. By oxidizing the metallic silicide portion 226a of the gate electrode 226 as described above with reference to FIG. 10, insulators 250, 252 may be formed between the contacts 220, 222 and the metallic portion 226a of the gate electrode 226. In one embodiment, the metallic silicide portion 226a and the contacts are formed from a nickel silicide.

Figure 14:
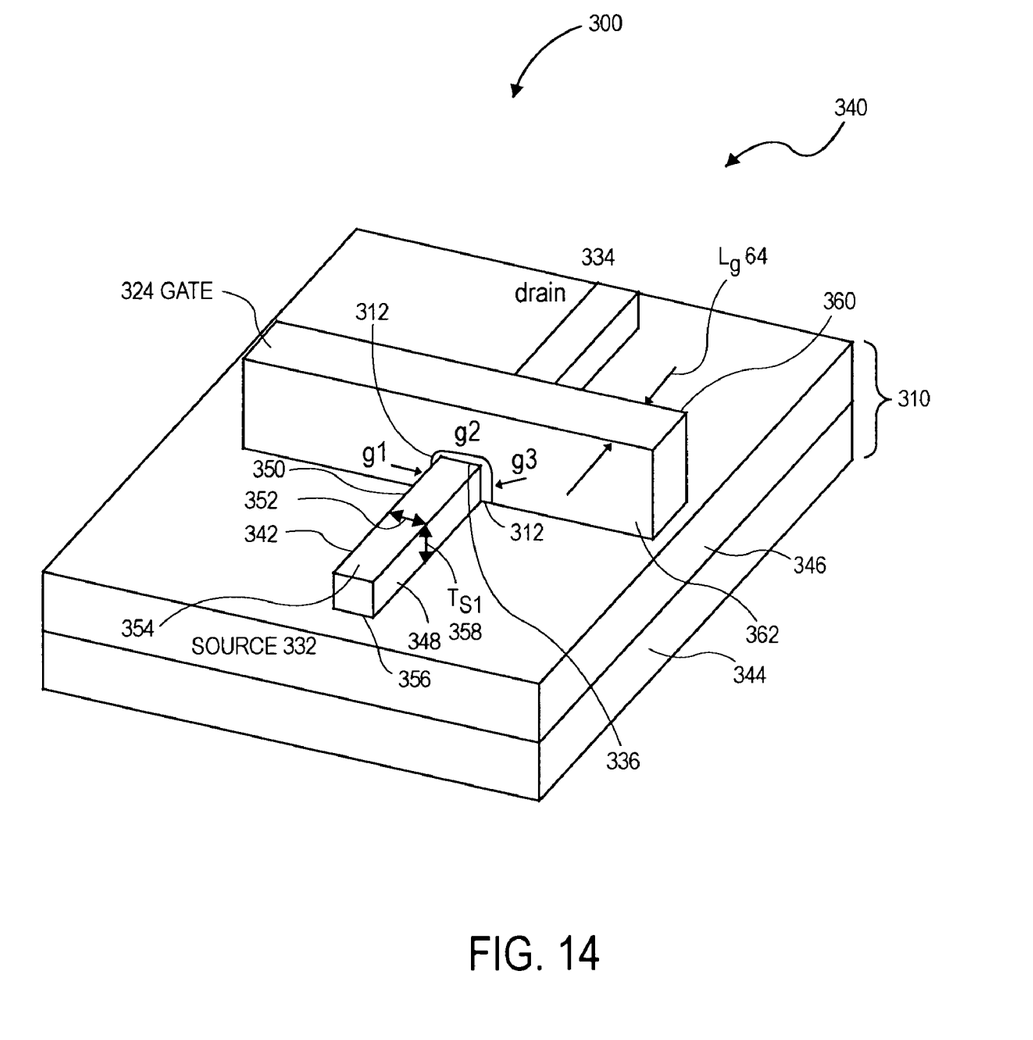
FIG. 14 is a perspective view of a tri-gate transistor according to an embodiment of the invention.

FIG. 14 is a perspective view of a tri-gate transistor 300, manufactured using the methods described in FIGS. 6-12, according to an embodiment of the invention. In one embodiment, the tri-gate transistor 300 includes insulators formed using the process described hereinabove with respect to semiconductor device 100.

The transistor 300 includes a substrate 310, a semiconductor body 342, a gate dielectric layer 312, a gate electrode 324, a source region, 332, a drain region 334, and a channel region 336. The substrate 10 includes a lower monocrystalline substrate 344 and an insulating layer 346. The semiconductor body 342 includes a pair of laterally opposite sidewalls 348 and 350 separated by a distance which defines a semiconductor body width 352, and a top surface 354 and a bottom surface 356 separated by a distance which defines a semiconductor body height 358. The gate electrode 324 has a pair of laterally opposite sidewalls 360 and 362 separated by a distance which defines the gate length 364 of the transistor 300.

The substrate 310 can be an insulating substrate or a semiconductor substrate. The dielectric layer 312 is formed on the top surface 354 and sidewalls 348, 350 of the semiconductor body 342. The gate electrode 324 is formed on the dielectric layer 312 of the top surface 354 of the semiconductor body 342 and is formed adjacent to the gate dielectric layer 312 formed on the sidewalls 348, 350 of the semiconductor body 342. The source and drain regions 332, 334 are formed in the semiconductor body 342 on opposite sides of the gate electrode 324. The gate electrode 324 may be a p-type, n-type of mid-gap metal.

Because the gate electrode 324 and the gate dielectric 312 surround the semiconductor body 342 on three sides, the transistor essentially has three separate channels and gates (g1, g2, g3). The gate "width" of a transistor is equal to the sum of each of the three sides of the semiconductor body. Larger "width" transistors can be formed by connecting several tri-gate transistors together.

The gates of transistor 340 are connected to a voltage source. A voltage is applied to source region 332, causing current to flow through the channel region 336 to the drain region 334. A voltage is also applied to the gate electrode 324, which interferes with the current flowing in the channel region 336. The voltage connected to the gate electrode 324 switches the current on and off in the channel region (g1, g2, g3).

An insulating layer (not shown) may be present between the gate electrode and source and drain contacts (not shown), formed as described above, to reverse a short circuit that may occur if the contacts touch the gate electrode 324.

Figure 15:
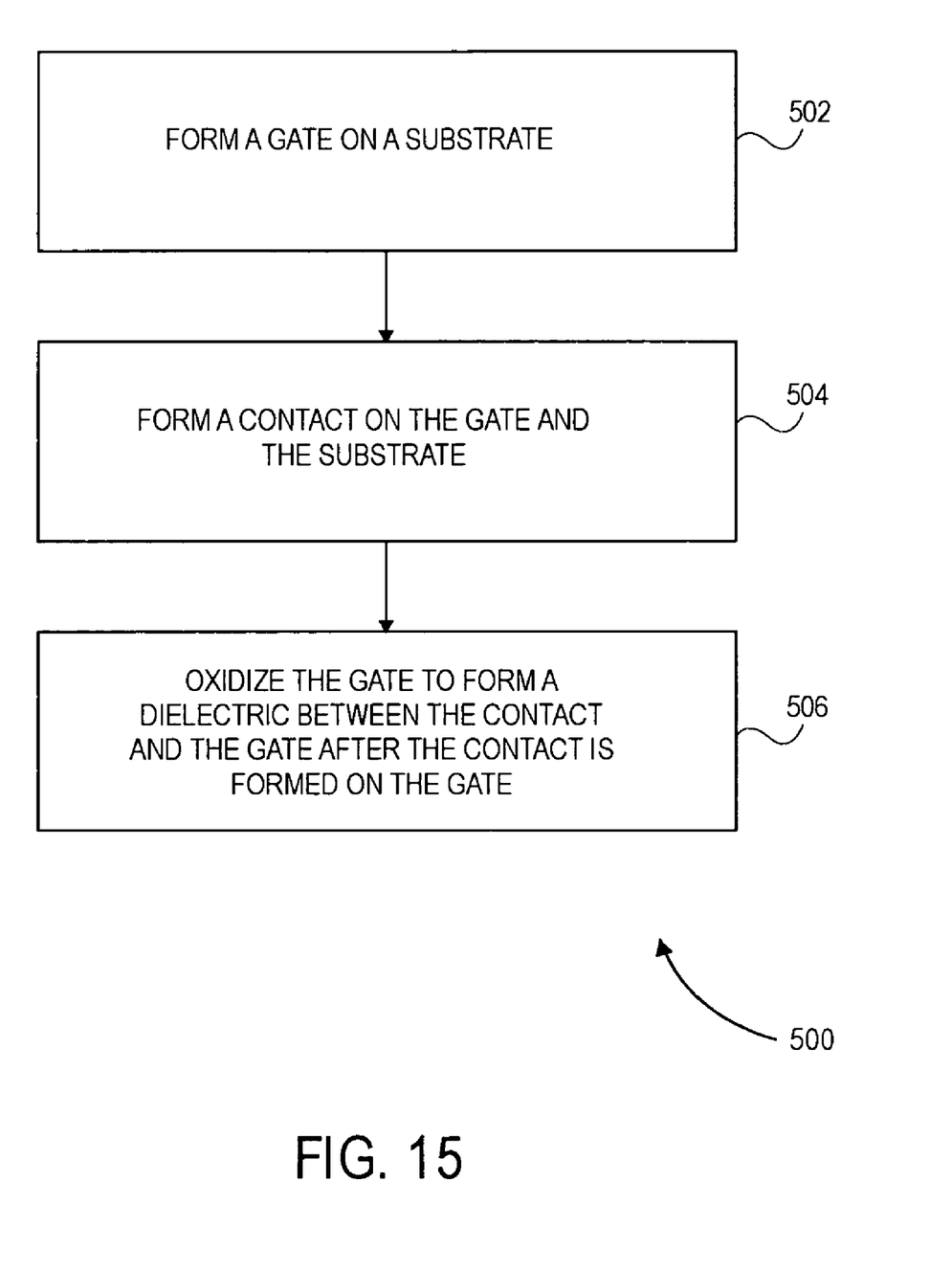
FIG. 15 is a block diagram showing a method of making a semiconductor device according to an embodiment of the invention.

FIG. 15 is a block diagram showing a process 500 for forming a semiconductor device according to an embodiment of the invention. In one embodiment, the semiconductor device is semiconductor devices 100, 200 or 300 described above with reference to FIGS. 5-14.

The process 500 begins at block 502, wherein a gate is formed on a substrate. The process continues at block 504 by forming a contact on the gate and the substrate. The process continues at block 506, by oxidizing the gate to form a dielectric between the contact and the gate after the contact is formed on the gate. It will be appreciated that the process 50 may include additional or fewer steps as described herein and as appreciated by those of skill in the art.

Embodiments of the present invention may be advantageous because oxidizing the shorted area of the gate offers a robust manufacturable process. In one embodiment, a major yield limiter (contact to gate shorts) is reduced or eliminated and major constraints for contact patterning are alleviated, allowing for more variability. From a lithography perspective, registration windows may be increased to allow for more critical dimension variability. From an etch perspective, the process may be more tolerant for different profiles (and hence critical dimensions) and time over-etches.

The methods which are described and illustrated herein are not limited to the exact sequence of acts described, nor are they necessarily limited to the practice of all of the acts set forth. Other sequences of events or acts, or less than all of the events, or simultaneous occurrence of the events, may be utilized in practicing the embodiments of the present invention.

The foregoing description with attached drawings is only illustrative of possible embodiments of the described method and should only be construed as such. Other persons of ordinary skill in the art will realize that many other specific embodiments are possible that fall within the scope and spirit of the present idea. The scope of the invention is indicated by the following claims rather than by the foregoing description. Any and all modifications which come within the meaning and range of equivalency of the following claims are to be considered within their scope.

The invention claimed is:

1. A transistor comprising:
   a substrate;
   a channel in the substrate;
   a source and drain on opposing sides of the channel in the substrate;
   source and drain contacts connected to the source and drain;
   a gate dielectric layer over the substrate;
   a gate electrode separated by the gate dielectric layer from the channel;
   a spacer between said gate electrode and said source and drain contacts; and
   wherein a portion of at least one of said source contact and said drain contact overlies said gate electrode, wherein said portion of said at least one of said source contact and said drain contact is isolated from said gate electrode by an insulator which is only between said gate electrode and said portion of said at least one of said source contact and said drain contact, wherein the entire insulator is laterally confined to within said gate electrode by said spacer, and wherein said insulator is an oxide of said gate electrode.

2. The transistor of claim 1, wherein said insulator is a metal oxide dielectric.

3. A semiconductor device comprising:
   a substrate;
   a gate on the substrate;
   a contact on the substrate and having a portion overlying the gate;
   a spacer between the gate electrode and the contact; and
   an insulation layer between the gate and the portion of the contact overlying the gate, wherein the insulation layer is only between the gate and the portion of the contact overlying the gate, wherein the entire insulation layer is laterally confined to within the gate electrode by the spacer, and wherein the insulation layer is an oxide of the gate.

4. The semiconductor device of claim 3, wherein the insulation layer comprises a dielectric.

5. The semiconductor device of claim 4, wherein the dielectric is a metal oxide dielectric.

6. The semiconductor device of claim 3, wherein the gate is metallic

7. The semiconductor device of claim 3, wherein the gate comprises a polysilicon gate having a salicided metal thereon.

8. The semiconductor device of claim 3, wherein the gate comprises nickel salicide.

* * * * *